United States Patent
Kim et al.

(10) Patent No.: US 11,459,653 B2
(45) Date of Patent: Oct. 4, 2022

(54) METHOD FOR MANUFACTURING MOLYBDENUM-CONTAINING THIN FILM AND MOLYBDENUM-CONTAINING THIN FILM MANUFACTURED THEREBY

(71) Applicant: DNF CO., LTD., Daejeon (KR)

(72) Inventors: Myong Woon Kim, Daejeon (KR); Sang Ick Lee, Daejeon (KR); Jang Woo Seo, Daejeon (KR); Sang Yong Jeon, Sejong-si (KR); Haeng Don Lim, Daejeon (KR)

(73) Assignee: DNF CO., LTD., Daejeon (KR)

( * ) Notice: Subject to any disclaimer, the term of this patent is extended or adjusted under 35 U.S.C. 154(b) by 0 days.

(21) Appl. No.: 17/294,377

(22) PCT Filed: Nov. 13, 2019

(86) PCT No.: PCT/KR2019/015399
§ 371 (c)(1),
(2) Date: May 14, 2021

(87) PCT Pub. No.: WO2020/101336
PCT Pub. Date: May 22, 2020

(65) Prior Publication Data
US 2022/0018017 A1     Jan. 20, 2022

(30) Foreign Application Priority Data

Nov. 14, 2018    (KR) ........................ 10-2018-0140266

(51) Int. Cl.
C23C 16/18     (2006.01)
C23C 16/455     (2006.01)
(Continued)

(52) U.S. Cl.
CPC .............. C23C 16/18 (2013.01); C07F 17/00 (2013.01); C23C 16/45553 (2013.01); C23C 16/56 (2013.01)

(58) Field of Classification Search
CPC .... C23C 16/18; C23C 16/20; C23C 16/45553
See application file for complete search history.

(56) References Cited

U.S. PATENT DOCUMENTS 7,041,596 B1 *   5/2006   Dalton ................ C23C 16/0245
                                                           257/E21.17
2013/0202794 A1 *   8/2013   Dussarrat .......... C23C 16/45557
                                                           427/252

(Continued)

FOREIGN PATENT DOCUMENTS

JP       H01238027 A     9/1989
JP       2018035375 A     3/2018

(Continued)

OTHER PUBLICATIONS

Machine translation of JP 2018-035375 (Year: 2018).*

(Continued)

*Primary Examiner* — Elizabeth A Burkhart
(74) *Attorney, Agent, or Firm* — McCoy Russell LLP

(57) ABSTRACT

The present invention provides a method for manufacturing a molybdenum-containing thin film and a molybdenum-containing thin film manufactured thereby. By using a molybdenum (0)-based hydrocarbon compound and a predetermined reaction gas, the method for manufacturing a molybdenum-containing thin film according to the present invention enables easy manufacturing of a highly pure thin film in a simple process.

13 Claims, 1 Drawing Sheet

(51) Int. Cl.
    *C23C 16/56*    (2006.01)
    *C07F 17/00*    (2006.01)

(56) References Cited

U.S. PATENT DOCUMENTS

2016/0133837 A1    5/2016    Hsueh et al.
2020/0339617 A1*  10/2020    Kim .................. C23C 16/45553

FOREIGN PATENT DOCUMENTS

| KR | 100287100 B1 | 4/2001 |
| KR | 20020094600 A | 12/2002 |
| KR | 20180114159 A | 10/2018 |
| KR | 20180117357 A | 10/2018 |
| WO | 2018191183 A1 | 10/2018 |

OTHER PUBLICATIONS

ISA Korean Intellectual Property Office, International Search Report Issued in Application No. PCT/KR2019/015399, dated Feb. 28, 2020, WIPO, 4 pages.

* cited by examiner

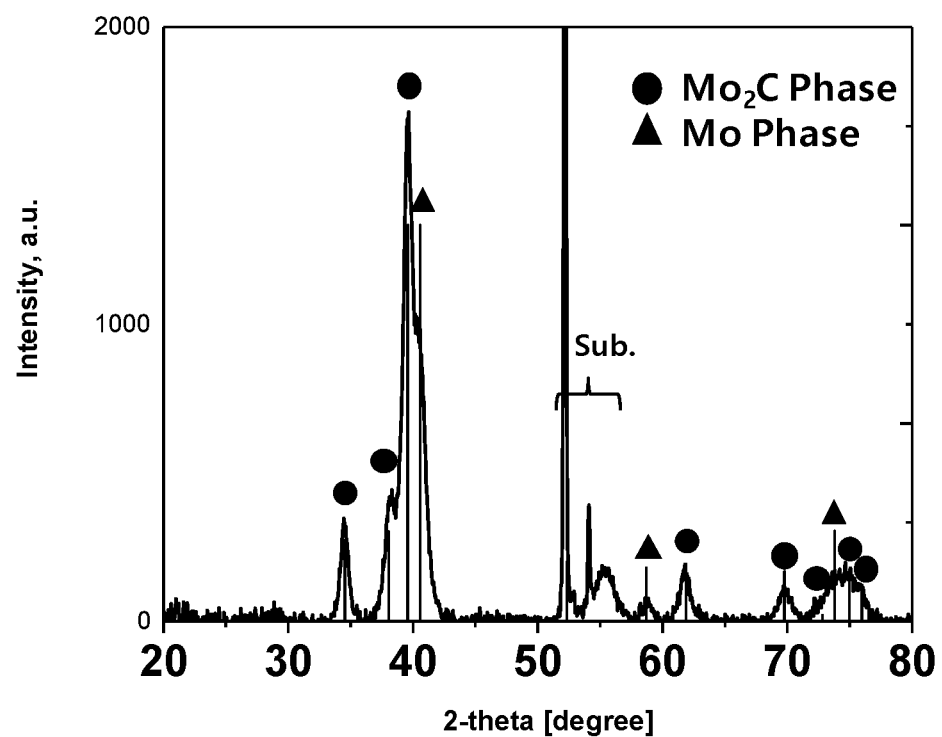

METHOD FOR MANUFACTURING MOLYBDENUM-CONTAINING THIN FILM AND MOLYBDENUM-CONTAINING THIN FILM MANUFACTURED THEREBY

CROSS REFERENCE TO RELATED APPLICATIONS

The present application is a U.S. National Phase of International Application No. PCT/KR2019/015399 entitled "METHOD FOR MANUFACTURING MOLYBDENUM-CONTAINING THIN FILM AND MOLYBDENUMCONTAINING THIN FILM MANUFACTURED THEREBY," and filed on Nov. 13, 2019. International Application No. PCT/KR2019/015399 claims priority to Korean Patent Application No. 10-2018-0140266 filed on Nov. 14, 2018. The entire contents of each of the above-listed applications are hereby incorporated by reference for all purposes.

TECHNICAL FIELD

The following disclosure relates to a method of manufacturing a molybdenum-containing thin film and a molybdenum-containing thin film manufactured therefrom, and more particularly, to a method of manufacturing a molybdenum-containing thin film by reacting a molybdenum(0)-based hydrocarbon compound used as a precursor for depositing a thin film with iodine, alkyl iodide, iodo silane, or a mixture thereof which is specific reaction gas, and a molybdenum-containing thin film manufactured therefrom.

BACKGROUND AND SUMMARY

A molybdenum-containing thin film may be used in organic light emitting diodes, liquid crystal displays, plasma display panels, field emission displays, thin film solar cells, low resistance ohmic contacts, other electronic devices and semiconductor devices, and are mainly used as members of electronic components such as barrier films.

Molybdenum, molybdenum oxides, and molybdenum nitrides are widely used in various fields, due to low resistance, a high work function and thermal/chemical stability. For example, molybdenum has a low specific resistance of 15μΩ·cm or less, and thus may be applied as materials for a wiring of a display device, molybdenum oxide ($MoO_2$) exhibits exceptional metal-like conductivity and may be applied as materials for a hydrocarbon oxidation catalyst, a solid oxide fuel cell (SOFC) anode, and a high-capacity reversible lithium ion battery (LIB) anode, and molybdenum trioxide ($MoO_3$) exhibits electrochromic and catalytic properties and may be applied as materials for a nanostructured gas sensor and a solid-state lithium ion battery.

Meanwhile, as a thin film deposition method in a semiconductor element, methods using molecular beam epitaxy (MBE), chemical vapor deposition (CVD), physical vapor deposition (PVD), or the like have been studied. Recently, as a design rule is decreased in accordance with a miniaturization of a semiconductor elements, as a deposition method satisfying a low temperature process, precise thickness control, uniformity and coatability of the thin film, a thin film formation using atomic layer deposition (ALD) according to self-limiting surface reaction mechanism has been widely studied.

Molybdenum carbonyl [$Mo(CO)_6$], molybdenum acetylacetonate, molybdenum chloride ($MoCl_3$ or $MoCl_5$), molybdenum fluoride ($MoF_6$), organic molybdenum compounds such as $MoO_2(2,2,6,6\text{-tetramethylheptane-3,5-dione})_2$, biscyclopentadienyl molybdenum dihydride, bismethylcyclopentadienyl molybdenum dihydride, bisethylcyclopentadienyl molybdenum dihydride, bisisopropylcyclopentadienyl molybdenum dihydride, biscyclopentadienylimide molybdenum, and molybdenum oxychloride ($MoO_2Cl_2$ or $MoOCl_4$) have been reported as raw materials for chemical vapor epitaxy for manufacturing a molybdenum oxide-containing thin film. In addition, a molybdenum amideimide compound has been reported as raw materials for forming a molybdenum-containing thin film by ALD.

However, a conventional process for depositing a molybdenum-containing thin film uses oxygen as a reaction gas, and thus a reduction process is essential.

Accordingly, there is demanded a method of manufacturing a high-purity molybdenum-containing thin film by reducing a content of impurities in the thin film by a simple process.

Technical Problem

An embodiment of the present invention is directed to providing a method of manufacturing a molybdenum-containing thin film using a molybdenum(0)-based hydrocarbon compound as a precursor for depositing a molybdenum-containing thin film simultaneously with using a specific reaction gas, and a molybdenum-containing thin film manufactured therefrom.

Another embodiment of the present invention is directed to providing a composition for depositing a molybdenum-containing thin film including a molybdenum(0)-based hydrocarbon compound and a specific reaction gas.

Technical Solution

The present invention is to provide a method of manufacturing a high-purity molybdenum-containing thin film by a simple process, by using a molybdenum(0)-based hydrocarbon compound as a precursor simultaneously with using a specific reaction gas.

In one general aspect, a method of manufacturing a molybdenum-containing thin film includes:

using a molybdenum(0)-based hydrocarbon compound as a precursor for depositing a thin film, and using iodine, (C1-C3)alkyl iodide, iodo silane, or a mixture thereof as a reaction gas to manufacture the molybdenum-containing thin film.

The method of manufacturing a molybdenum-containing thin film according to an exemplary embodiment of the present invention may be performed by atomic layer deposition (ALD), chemical vapor deposition (CVD), a metalorganic chemical vapor deposition (MOCVD), low pressure chemical vapor deposition (LPCVD), plasma-enhanced chemical vapor deposition (PECVD), or plasma-enhanced atomic layer deposition (PEALD).

The method of manufacturing a molybdenum-containing thin film according to an exemplary embodiment of the present invention may include:

a) maintaining a temperature of a substrate mounted in a chamber at 80 to 500° C.;

b) injecting a carrier gas and the molybdenum(0)-based hydrocarbon compound; and c) injecting a reaction gas which is iodine, (C1-C3)alkyl iodide, iodo silane, or a mixture thereof to manufacture the molybdenum-containing thin film on the substrate.

The reaction gas according to an exemplary embodiment of the present invention may be used at 0.1 to 200 mol, based on 1 mol of the molybdenum(0)-based hydrocarbon compound.

The method of manufacturing a molybdenum-containing thin film according to an exemplary embodiment of the present invention may further include, after c), performing heat treatment, and the heat treatment may be performed at 200 to 700° C.

The molybdenum(0)-based hydrocarbon compound according to an exemplary embodiment of the present invention may be represented by the following Formula 1, 2 or 3:

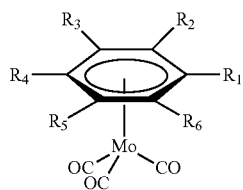

[Formula 1]

wherein $R_1$ to $R_6$ are each independently hydrogen or C1-C7alkyl;

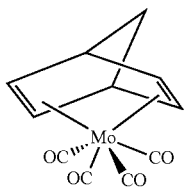

[Formula 2]

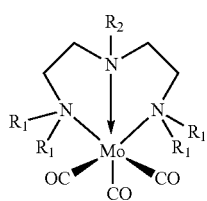

[Formula 3]

wherein $R_1$ and $R_2$ are each independently hydrogen or C1-C7alkyl.

The reaction gas according to an exemplary embodiment of the composition may be $I_2$, $CH_3I$, $CH_2I_2$, $CHI_3$, $CH_3CH_2I$, $CH_3CHI_2$, $ICH_2CH_2I$, $CH_3CH_2CH_2I$, $CH_3CHICH_3$, $ICH_2CH_2CH_2$, or $SiH_2I_2$, and the carrier gas may be any one or two or more selected from the group consisting of nitrogen ($N_2$), hydrogen, argon, and helium.

In another general aspect, there is provided a composition for depositing a molybdenum-containing thin film including a molybdenum(0)-based hydrocarbon compound as a precursor and reaction gas which is iodine, (C1-C3)alkyl iodide, iodo silane, or a mixture thereof.

The reaction gas according to an exemplary embodiment of the composition for depositing a molybdenum-containing thin film of the present invention may be used at 0.1 to 200 mol, based on 1 mol of the molybdenum(0)-based hydrocarbon compound, and the molybdenum(0)-based hydrocarbon compound may be any one or two or more selected from the group consisting of molybdenum(0)-based hydrocarbon compounds represented by Chemical Formulae 1, 2 and 3.

The reaction gas according to an exemplary embodiment of the composition for depositing a molybdenum-containing thin film of the present invention may be $I_2$, $CH_3I$, $CH_2I_2$, $CHI_3$, $CH_3CH_2I$, $CH_3CHI_2$, $ICH_2CH_2I$, $CH_3CH_2CH_2I$, $CH_3CHICH_3$, $ICH_2CH_2CH_2$, or $SiH_2I_2$.

A molybdenum-containing thin film may be manufactured using the composition for depositing a molybdenum-containing thin film according to an exemplary embodiment of the present invention, and the manufactured molybdenum-containing thin film may have a specific resistance of 200 μΩ·cm or less and an oxygen content of 10% or less.

The molybdenum-containing thin film of the present invention according to an exemplary embodiment of the present invention may have a carbon content of 30% or less.

Advantageous Effects

The method of manufacturing a molybdenum-containing thin film of the present invention uses a molybdenum(0)-based hydrocarbon compound as a precursor for depositing a thin film, while using a specific reaction gas, that is, iodine, (C1-C3)alkyl iodide, iodo silane, or a mixture thereof as a reaction gas, thereby not including oxygen so that a separate reduction process is not needed, and thus, the molybdenum-containing thin film may be manufactured by a simple process.

In addition, the method of manufacturing a molybdenum-containing thin film of the present invention may manufacture a thin film having a uniform surface at a thin film thickness of 2 nm or less, and allow a gap-fill without void and a high step coverage.

Further, the method of manufacturing a molybdenum-containing thin film of the present invention does not use oxygen as a reaction gas, but uses iodine, (C1-C3)alkyl iodide, iodo silane, or a mixture thereof, thereby minimizing a content of impurities such as carbon, oxygen and hydrogen, and thus, the thin film has remarkably excellent purity.

Furthermore, the method of manufacturing a molybdenum-containing thin film of the present invention may use various molybdenum(0)-based hydrocarbon compounds as a precursor.

Furthermore, the composition for depositing a molybdenum-containing thin film of the present invention uses a specific compound, that is, iodine, (C1-C3)alkyl iodide, iodo silane, or a mixture thereof as a reaction gas, and thus, when the molybdenum-containing thin film is formed using the composition, a high-purity thin film having an excellent step coverage and a gap-fill, and high density may be easily obtained.

The molybdenum-containing thin film manufactured by the manufacturing method according to the present invention may be deposited on a trench, a contact, or a via pattern having a high aspect ratio due to miniaturization of a semiconductor element, with uniform and excellent step coverage.

BRIEF DESCRIPTION OF THE FIGURES

FIG. 1 is a result of X-ray diffraction analysis of a molybdenum-containing thin film deposited in Example 1.

DETAILED DESCRIPTION

Hereinafter, the present invention will be describe a method of manufacturing a molybdenum-containing thin film, a composition for depositing a molybdenum-containing thin film, and a molybdenum-containing thin film manufactured therefrom, however, technical terms and scientific terms used herein have the general meaning understood by those skilled in the art to which the present invention pertains unless otherwise defined, and a description for the known function and configuration obscuring the present invention will be omitted in the following description.

"Alkyl" and other substituents containing an "alkyl" moiety described herein include both straight chain and branched chain forms, and have 1 to 10 carbon atoms, preferably, 1 to 7 carbon atoms, more preferably, 1 to 3 carbon atoms.

In addition, an "alkene compound" described herein which is an acyclic or cyclic hydrocarbon compound, is an organic radical derived from hydrocarbon containing one or more double bonds.

A "heteroalkene-like compound" which is an alkene compound containing one or more heteroatoms in an alkene compound may be an acyclic or cyclic, in which the heteroatom may be selected from the group consisting of nitrogen, oxygen, sulfur, phosphorus, or the like, however, may be preferably oxygen or nitrogen, and may contain one or two or more of oxygen or nitrogen.

A carbonyl-containing compound described herein may be used as a ligand of a molybdenum(0)-based hydrocarbon compound, and may be any compound having a carbonyl group, however, as a preferred example, the carbonyl-containing compound may be CO or acetylacetonate, but is not limited thereto.

In the present invention, a molybdenum(0)-based hydrocarbon compound is used as a precursor, and a specific reaction gas, that is iodine, (C1-C3)alkyl iodide, iodo silane, or a mixture thereof is used, whereby a separate reduction process is not needed, so that a method of manufacturing a high-purity molybdenum-containing thin film by a simple process is provided. A thin film having a uniform surface at a thin film thickness of 2 nm or less may be manufactured, and a high step coverage and a gap-fill without void are allowed.

The method of manufacturing a molybdenum-containing thin film of the present invention includes:
using a molybdenum(0)-based hydrocarbon compound as a precursor for depositing a thin film, and
using iodine, (C1-C3)alkyl iodide, iodo silane, or a mixture thereof as a reaction gas to manufacture the molybdenum-containing thin film.

The method of manufacturing a molybdenum-containing thin film of the present invention does not use oxygen which is a conventionally used as a reaction gas, whereby a high-purity thin film may be manufactured, and a separate reduction process for removing oxygen contained in the thin film is not needed. Thus, the molybdenum-containing thin film may be manufactured by a simple process.

The method of manufacturing a molybdenum-containing thin film according to an exemplary embodiment of the present invention may be performed by atomic layer deposition (ALD), chemical vapor deposition (CVD), metalorganic chemical vapor deposition (MOCVD), low pressure chemical vapor deposition (LPCVD), plasma-enhanced chemical vapor deposition (PECVD), or plasma-enhanced atomic layer deposition (PEALD), and in terms of having high purity and excellent physical properties, preferably atomic layer deposition (ALD) or chemical vapor deposition (CVD).

The method of manufacturing a molybdenum-containing thin film of the present invention is not limited, as long as the method is a method of reacting a molybdenum(0)-based hydrocarbon compound used as a precursor with a reaction gas which is iodine, (C1-C3)alkyl iodide, iodo silane, or a mixture thereof to manufacture a molybdenum-containing thin film, however, preferably, the method of manufacturing a molybdenum-containing thin film according to an exemplary embodiment of the present invention may include:
a) maintaining a temperature of a substrate mounted in a chamber at 80 to 500° C.;
b) injecting a carrier gas and the molybdenum(0)-based hydrocarbon compound; and
c) injecting a reaction gas which is iodine, (C1-C3)alkyl iodide, iodo silane, or a mixture thereof to manufacture the molybdenum-containing thin film on the substrate.

In the method of manufacturing a molybdenum-containing thin film according to an exemplary embodiment of the present invention, the molybdenum(0)-based hydrocarbon compound used as a precursor is a liquid compound at room temperature and atmospheric pressure, and may be added to the process chamber by being changed to a gaseous state by a method such as heating for thin film deposition.

In the method of manufacturing a molybdenum-containing thin film according to an exemplary embodiment of the present invention, the reaction gas may be added to the process chamber having a substrate on which the molybdenum(0)-based hydrocarbon compound is adsorbed by being changed to a gaseous state by a method such as heating.

In the method of manufacturing a molybdenum-containing thin film according to an exemplary embodiment of the present invention, the molybdenum(0)-based hydrocarbon compound and the reaction gas may be organically or independently of each other supplied into the chamber. The molybdenum(0)-based hydrocarbon compound and the reaction gas may also be continuously or discontinuously supplied into a chamber, respectively, and a discontinuous supply may include a pulse form.

In the method of manufacturing a molybdenum-containing thin film according to an exemplary embodiment of the present invention, after step b) and/or step c), for exhausting unreacted molybdenum(0)-based hydrocarbon compound gas or by-produced gas, or unreacted reaction gas, supplying inert gas into a chamber to perform purging may further be performed. The inert gas may be any one or two or more selected from the group consisting of nitrogen ($N_2$), argon, and helium.

That is, the manufacturing method according to an exemplary embodiment of the present invention may include: a) maintaining a temperature of a substrate mounted in a chamber at 80 to 500° C.; b) injecting a carrier gas and the molybdenum(0)-based hydrocarbon compound; d1) using inert gas to purge the inside of the chamber; c) injecting a reaction gas which is iodine, (C1-C3)alkyl iodide, iodo silane, or a mixture thereof to manufacture the molybdenum-containing thin film on the substrate; and d2) using the inert gas to purge the inside of the chamber.

The substrate according to an exemplary embodiment of the present invention is any one which may be used within the scope recognized by a person skilled in the art, the temperature of the substrate is also not limited, however, may be preferably 200 to 400° C., and the temperature range depends on decomposition properties of the molybdenum (0)-based hydrocarbon compound used as the precursor itself, and the reaction properties with other materials such as iodine, (C1-C3)alkyl iodide, iodo silane, or a mixture thereof used as the reaction gas.

The substrate which may be used in an exemplary embodiment of the present invention may be, but is not limited to, a substrate including one or more semiconductor materials among Si, Ge, SiGe, GaP, GaAs, SiC, SiGeC, InAs and InP; a flexible plastic substrate such as a SOI (silicon on insulator) substrate; a quartz substrate; a glass substrate for display; a flexible plastic substrate such as polyimide, polyethylene terephthalate (PET), polyethylene naphthalate (PEN), polymethyl methacrylate (PMMA), polycarbonate (PC), polyethersulfone (PES) and polyester; or a tungsten substrate.

In the method of manufacturing a molybdenum-containing thin film according to an exemplary embodiment of the present invention, corresponding deposition conditions except using the molybdenum(0)-based hydrocarbon compound as the precursor, and the reaction gas which is iodine, (C1-C3)alkyl iodide, iodo silane, or a mixture thereof, may be adjusted depending on the structure or thermal properties of a desired thin film.

As deposition conditions according to an exemplary embodiment of the present invention, an input flow rate of the molybdenum(0)-based hydrocarbon compound as the precursor, an input flow rate of carrier gas, pressure, RF power, a substrate temperature, or the like may be included. As a non-limited example of such deposition conditions, an input flow rate of the molybdenum(0)-based hydrocarbon compound of 1 to 1000 cc/min, an input flow rate of the carrier gas of 1 to 1000 cc/min, a flow rate of the reaction gas of 1 to 1000 cc/min, a pressure of 0.1 to 100 torr, an RF power of 200 to 1000 W, a substrate temperature of 80 to 500° C., preferably 200 to 400° C. may be adjusted within the range, but is not limited thereto.

Preferably, the reaction gas according to an exemplary embodiment of the present invention may be used at 0.1 to 200 mol, based on 1 mol of the molybdenum(0)-based hydrocarbon compound, but is not limited thereto, and may be adjusted depending on the thin film deposition conditions. As an example, in the case of atomic layer deposition (ALD) or plasma-enhanced chemical vapor deposition (PECVD), the reaction gas may be used, preferably at 10 to 100 mol, more preferably 10 to 50 mol, and still more preferably 10 to 30 mol, based on 1 mol of the molybdenum (0)-based hydrocarbon compound.

The method of manufacturing a molybdenum-containing thin film according to an exemplary embodiment of the present invention may further include, after c), performing heat treatment, and the heat treatment may be performed at 200 to 700° C. for 30 minutes to 4 hours, preferably, 300 to 600° C. for 1 hour to 2 hours, under a hydrogen atmosphere.

The molybdenum(0)-based hydrocarbon compound according to an exemplary embodiment of the present invention may be any one as long as the compound is a molybdenum(0)-based hydrocarbon compound which may be used as the precursor for depositing a molybdenum-containing thin film, however, as a preferred combination of iodine, (C1-C3)alkyl iodide, iodo silane, or a mixture thereof which is the reaction gas, the molybdenum(0)-based hydrocarbon compound may be represented by the following Formula 1, 2, or 3:

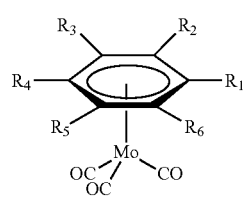

[Formula 1]

wherein $R_1$ to $R_6$ are each independently hydrogen or C1-C7alkyl;

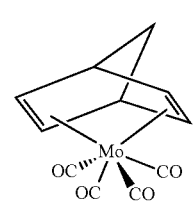

[Formula 2]

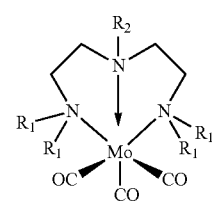

[Formula 3]

wherein $R_1$ and $R_2$ are each independently hydrogen or C1-C7alkyl.

More preferably, the molybdenum(0)-based hydrocarbon compound according to an exemplary embodiment of the present invention may be a compound selected from the following structures, but is not limited thereto.

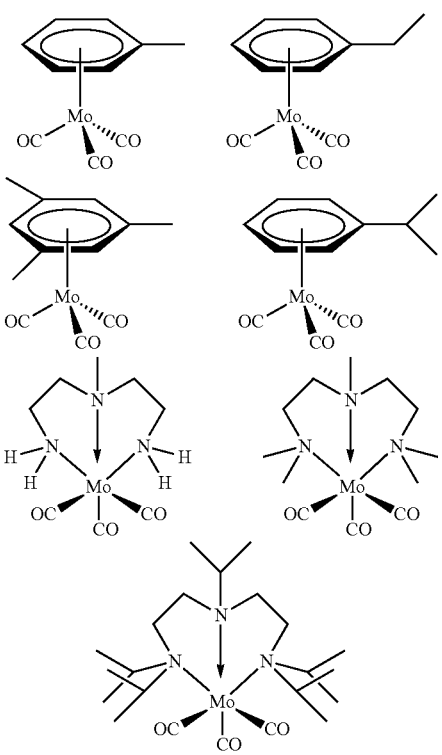

Preferably, the reaction gas according to an exemplary embodiment of the present invention may be $I_2$, $CH_3I$, $CH_2I_2$, $CHI_3$, $CH_3CH_2I$, $CH_3CHI_2$, $ICH_2CH_2I$, $CH_3CH_2CH_2I$, $CH_3CHICH_3$, $ICH_2CH_2CH_2I$, or $SiH_2I_2$, and more preferably $CH_3CH_2I$, $CH_2I_2$, $ICH_2CH_2I$, or $SiH_2I_2$.

In the method of manufacturing a molybdenum-containing thin film according to an exemplary embodiment of the present invention, the molybdenum(0)-based hydrocarbon compound may be supplied into the chamber together with the carrier gas. Specifically, the carrier gas may be any one or two or more selected from the group consisting of nitrogen ($N_2$), hydrogen, argon, and helium, and a preferred combination with the specific reaction gas of the present invention, may be any one or two or more inert gases selected from the group consisting of nitrogen ($N_2$), argon, and helium.

The molybdenum-containing thin film is any thin film which may be manufactured within the scope recognized by a person skilled in the art of supplying a molybdenum precursor in a gaseous phase to manufacture the molybdenum-containing thin film. As a specific and substantial example, the molybdenum-containing thin film may be generally a molybdenum film, a molybdenum oxide film, or a hybrid film thereof having conductivity, and besides, various high-quality thin films containing molybdenum may be manufactured within the scope recognizable by a person skilled in the art.

In addition, the present invention provides a composition for depositing a molybdenum-containing thin film including a molybdenum(0)-based hydrocarbon precursor compound and reaction gas which is iodine, (C1-C30)alkyl iodide, iodo silane, or a mixture thereof.

Preferably, the reaction gas according to an exemplary embodiment of the composition for depositing a molybdenum-containing thin film of the present invention may be used at 0.1 to 200 mol, preferably 10 to 100 mol, more preferably 10 to 50 mol, and more preferably 10 to 30 mol, based on 1 mol of the molybdenum(0)-based hydrocarbon compound, and the molybdenum(0)-based hydrocarbon compound may be any one or two or more selected from the group consisting of molybdenum(0)-based hydrocarbon compounds represented by Chemical Formulae 1, 2 and 3.

Preferably, the reaction gas according to an exemplary embodiment of the composition for depositing a molybdenum-containing thin film of the present invention may be $I_2$, $CH_3I$, $CH_2I_2$, $CHI_3$, $CH_3CH_2I$, $CH_3CHI_2$, $ICH_2CH_2I$, $CH_3CH_2CH_2I$, $CH_3CHICH_3$, $ICH_2CH_2CH_2$, or $SiH_2I_2$.

In addition, the present invention provides a molybdenum-containing thin film manufactured using the composition for depositing a molybdenum-containing thin film according to an exemplary embodiment of the present invention, and the manufactured molybdenum-containing thin film may have a specific resistance of 200 μΩ·cm or less and an oxygen content of 10% or less, and preferably 6% or less.

Preferably, the molybdenum-containing thin film according to an exemplary embodiment of the present invention may have a carbon content of 30% or less, and preferably 26% or less.

The molybdenum-containing thin film of the present invention having high purity, high density and high durability may be manufactured by a simple process, by using the molybdenum(0)-based hydrocarbon compound and specific reaction gas, that is, iodine, (C1-C3)alkyl iodide, iodo silane, or a mixture thereof. In addition, when manufacturing the molybdenum-containing thin film, as the reaction gas, not oxygen, iodine, (C1-C3)alkyl iodide, iodo silane, or a mixture thereof is used, whereby a lower film of the molybdenum-containing thin film may not be oxidized during a deposition process and the lower film thereof may not be oxidized even after formation. Thus, an increase in contact resistance between the molybdenum-containing thin film and the lower film due to an oxide formed at the interface with the lower film, may be prevented.

In addition, when manufacturing the molybdenum-containing thin film, the molybdenum(0)-based hydrocarbon compound and specific reaction gas, that is, iodine, (C1-C3) alkyl iodide, iodo silane, or a mixture thereof are used to improve crystal quality, whereby specific resistance of the thin film may be decreased to 200μΩ·cm or less, preferably 150μΩ·cm or less, and more preferably 110 μΩ·cm or less, and an oxygen content in the thin film may be decreased to 10% or less, and preferably 6% or less.

Hereinafter, the present invention will be described in more detail by the following examples. Prior to that, terms and words used in the present specification and claims are not to be construed as a general or dictionary meaning but are to be construed as meanings and concepts meeting the technical ideas of the present invention based on a principle that the inventors can appropriately define the concepts of terms in order to describe their own inventions in best mode.

Therefore, the examples described herein and the configurations illustrated in drawings are merely the most preferred exemplary embodiment of the present invention but do not represent all of the technical spirit of the present invention. Thus, it should be understood that there are various equivalents and modified examples which may be substituted for them at the time of filing the present application.

In addition, the following examples were all carried out by the known atomic layer deposition (ALD) using 200 mm single wafer type ALD equipment (CN1, Atomic Premium) in a shower head mode which is commercialized.

For the deposited molybdenum-containing thin film, the specific resistance was measured using a sheet resistance meter (4 point probe, DASOLENG, ARMS-200C), the thickness was measured by a transmission electron microscope (FEI (Netherlands) Tecnai G$^2$F30S-Twin), and the composition of the thin film was analyzed using X-ray photoelectron analysis.

[Example 1] Manufacture of Molybdenum-Containing Thin Film

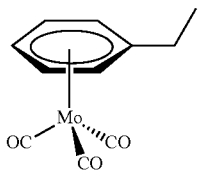

(Compound 1)

was used as a molybdenum-containing precursor compound, and diiodomethane ($CH_2I_2$) was used as a reaction gas to form a molybdenum-containing thin film by atomic layer deposition.

First, a silicon oxide film substrate was maintained at 250° C., and Compound 1 was filled into a stainless steel bubbler vessel, which was maintained at 70° C. Compound 1 which was vaporized in the stainless steel bubbler vessel was transferred to a silicon dioxide substrate for 1 second (0.0003 g) using argon gas (50 sccm) as carrier gas, and allowed to be adsorbed on the silicon oxide film substrate. Next, Compound 1 which was unreacted was removed therefrom for 10 seconds using argon gas (4000 sccm). Thereafter, diiodomethane ($CH_2I_2$) heated to 90° C. was supplied for 0.5 seconds (0.00625 g) to form a molybdenum-containing thin film. Finally, reaction by-products and remaining reaction gas were removed for 30 seconds using argon gas (4000 sccm). The reaction gas (diiodomethane) was used at 22.2 mol, based on 1 mol of the molybdenum-containing precursor (Compound 1). The above-described process was set to be 1 cycle, and 800 cycles were repeated to form the molybdenum-containing thin film. Detailed reaction conditions are shown in the following Table 1.

The formed molybdenum thin film was subjected to heat treatment at 500° C. for 2 hours under a hydrogen atmosphere.

[Comparative Example 1] Manufacture of Molybdenum-Containing Thin Film

A molybdenum-containing thin film was manufactured in the same manner as that in Example 1, except that no reaction gas was used. Detailed conditions of the molybdenum-containing thin film deposition are shown in the following Table 1.

The formed molybdenum thin film was subjected to heat treatment at 500° C. for 2 hours under a hydrogen atmosphere.

TABLE 1

|  |  | Example 1 | Comp. Example 1 |
|---|---|---|---|
| Substrate temperature (° C.) |  | 250 | 250 |
| Mo precursor | Precursor heating temperature (° C.) | 70 | 70 |
|  | Precursor injection time (second) | 1 | 1 |
| Purge | Flow rate (sccm) | 4000 | 4000 |
|  | Time (second) | 10 | 10 |
| Diiodomethane (reaction gas) | Heating temperature (° C.) | 90 | — |
|  | Injection time (second) | 0.5 | — |
| Purge | Flow rate (sccm) | 4000 | — |
|  | Time (second) | 30 | — |
| Number of deposition | Cycle | 800 | 800 |

The specific resistance calculated from the thickness and sheet resistance of the molybdenum-containing thin film manufactured in Example 1 and Comparative Example 1, and the composition analyzed by X-ray photoelectron analysis are shown in the following Table 2.

TABLE 2

|  | Specific resistance [μΩ · cm] | X-ray photoelectron analysis | | |
|---|---|---|---|---|
|  |  | Mo [%] | C [%] | O [%] |
| Example 1 | 108 | 69.3 | 25.7 | 5.0 |
| Comp. Example 1 | 312 | 55.3 | 32.2 | 12.5 |

As shown in Table 2, the molybdenum-containing thin film deposited in Example 1 using alkyl iodide as the reaction gas had specific resistance of 108μΩ·cm, which was ⅓ lower than that of the molybdenum-containing thin film deposited in Comparative Example 1 in which alkyl iodine was not used as the reaction gas.

In addition, as the results of X-ray photoelectron analysis, it could be confirmed that the molybdenum-containing thin film of Example 1 using alkyl iodide as the reaction gas had a molybdenum content of 69.3%, i.e., about 70% in the thin film. Also, it could be confirmed that the molybdenum-containing thin film had an oxygen content of 5% in the thin film, which was significantly lower than the oxygen content in the thin film of Comparative Example 1 in which alkyl iodide was not used as the reaction gas.

In addition, the results of X-ray diffraction analysis of the molybdenum-containing thin film deposited in Example 1 are shown in FIG. 1, and the molybdenum-containing thin film deposited therefrom was confirmed as a $Mo_2C$ phase and a Mo phase.

The invention claimed is:

1. A method of manufacturing a molybdenum-containing thin film, the method comprising:
    using a molybdenum(0)-based hydrocarbon compound as a precursor for depositing a thin film, wherein the molybdenum (0)-based hydrocarbon compound is represented by the following Formula 1, 2, or 3:

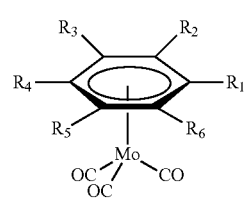

[Formula 1]

wherein $R_1$ to $R_6$ are each independently hydrogen or C1-C7alkyl,

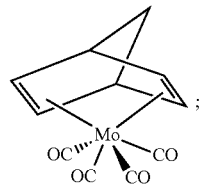

[Formula 2]

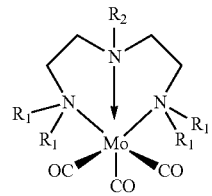

[Formula 3]

wherein $R_1$ and $R_2$ are each independently hydrogen or C1-C7alkyl, and
using iodine, (C1-C3)alkyl iodide, iodo silane, or a mixture thereof as a reaction gas to manufacture the molybdenum-containing thin film.

2. The method of claim 1, wherein the method is performed by atomic layer deposition (ALD), chemical vapor deposition (CVD), metalorganic chemical vapor deposition (MOCVD), low pressure chemical vapor deposition (LPCVD), plasma-enhanced chemical vapor deposition (PECVD), or plasma-enhanced atomic layer deposition (PEALD).

3. The method of claim 1, wherein the method includes:
    a) maintaining a temperature of a substrate mounted in a chamber at 80 to 500° C.;
    b) injecting a carrier gas and the molybdenum(0)-based hydrocarbon compound; and c) injecting a reaction gas which is iodine, (C1-C3)alkyl iodide, iodo silane, or a mixture thereof to manufacture the molybdenum-containing thin film on the substrate.

4. The method of claim 3, further comprising, after c), performing heat treatment.

5. The method of claim 4, wherein the heat treatment is performed at 200 to 700° C.

6. The method of claim 3, wherein the carrier gas is any one or two or more selected from a group consisting of nitrogen, hydrogen, argon, and helium.

7. The method of claim 1, wherein the reaction gas is used at 0.1 to 200 mol, based on 1 mol of the molybdenum(0)-based hydrocarbon compound.

8. The method of claim 1, wherein the reaction gas is $I_2$, $CH_3I$, $CH_2I_2$, $CHI_3$, $CH_3CH_2I$, $CH_3CHI_2$, $ICH_2CH_2I$, $CH_3CH_2CH_2I$, $CH_3CHICH_3$, $ICH_2CH_2CH_2I$, or $SiH_2I_2$.

9. A composition for depositing a molybdenum-containing thin film, the composition comprising:

a molybdenum(0)-based hydrocarbon compound as a precursor represented by the following Formula 1, 2, or 3,

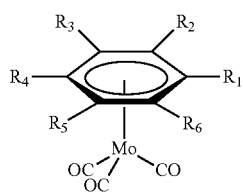

[Formula 1]

wherein $R_1$ to $R_6$ are each independently hydrogen or C1-C7alkyl,

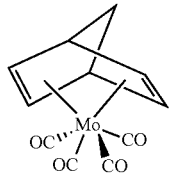

[Formula 2]

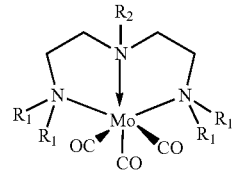

[Formula 3]

wherein $R_1$ and $R_2$ are each independently hydrogen or C1-C7alkyl; and iodine, (C1-C3)alkyl iodide, iodo silane, or a mixture thereof as reaction gas.

10. The composition of claim 9, wherein the reaction gas is used at 0.1 to 200 mol, based on 1 mol of the molybdenum (0)-based hydrocarbon compound.

11. The composition of claim 9, wherein the reaction gas is $I_2$, $CH_3I$, $CH_2I_2$, $CHI_3$, $CH_3CH_2I$, $CH_3CHI_2$, $ICH_2CH_2I$, $CH_3CH_2CH_2I$, $CH_3CHICH_3$, $ICH_2CH_2CH_2I$, or $SiH_2I_2$.

12. A molybdenum-containing thin film, manufactured using the composition for depositing a molybdenum-containing thin film of claim 9, having a specific resistance of 200 μΩ·cm or less and having an oxygen content of 10% or less.

13. The molybdenum-containing thin film of claim 12, wherein the molybdenum-containing thin film has a carbon content of 30% or less.

* * * * *